(12) United States Patent
Hosoya

(10) Patent No.: US 7,145,230 B2
(45) Date of Patent: Dec. 5, 2006

(54) SEMICONDUCTOR DEVICE WITH A SOLDER CREEP-UP PREVENTION ZONE

(75) Inventor: Futoshi Hosoya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/024,597

(22) Filed: Dec. 30, 2004

(65) Prior Publication Data

US 2005/0161802 A1    Jul. 28, 2005

(30) Foreign Application Priority Data

Jan. 26, 2004   (JP) ............................. 2004-016772

(51) Int. Cl.
*H01L 23/043* (2006.01)
*H01L 23/10* (2006.01)
*H01L 23/12* (2006.01)
*H01L 23/06* (2006.01)
*H01L 23/04* (2006.01)

(52) U.S. Cl. ....................... 257/708; 257/709; 257/710; 257/711; 257/729; 257/730; 257/731

(58) Field of Classification Search ........ 257/708–711, 257/729–731
See application file for complete search history.

(56) References Cited

U.S. PATENT DOCUMENTS

| | | | | |
|---|---|---|---|---|
| 5,023,398 | A * | 6/1991 | Mahulikar et al. ......... 174/52.4 |
| 5,639,990 | A * | 6/1997 | Nishihara et al. ........... 174/527 |
| 6,184,575 | B1 * | 2/2001 | Chillara et al. ............. 257/692 |
| 6,784,537 | B1 * | 8/2004 | Moriguchi ................... 257/706 |
| 6,963,130 | B1 * | 11/2005 | Djekic ......................... 257/706 |
| 7,019,335 | B1 * | 3/2006 | Suenaga ...................... 257/99 |
| 2001/0048116 | A1 | 12/2001 | Standing et al. ............ 257/177 |
| 2003/0137040 | A1 * | 7/2003 | Standing ..................... 257/685 |
| 2004/0135645 | A1 * | 7/2004 | Koyama et al. ............ 331/158 |
| 2005/0029535 | A1 * | 2/2005 | Mazzochette et al. ...... 257/100 |

* cited by examiner

*Primary Examiner*—Ida M. Soward
(74) *Attorney, Agent, or Firm*—McGinn IP Law Group PLLC

(57) ABSTRACT

The present invention provides a semiconductor device which includes a U-shaped metal package base, and a semiconductor chip having at least surface electrodes and being mounted on the inner bottom portion of the U-shaped metal package base, wherein the metal package base has, in a portion thereof ranging from the opened side end portion of the inner side wall to the semiconductor chip, a creep-up preventive zone preventing solder entering from the opened side end portion from creeping up. The device makes it possible to solve problems which have been apprehended for conventional semiconductor devices configured as mounting a semiconductor chip on a small semiconductor package, in that reduction in distance between external terminal portions of the metal package and the semiconductor chip results in contact of a solder for mounting with the semiconductor chip to thereby adversely affect the electrical properties and reliability thereof, and in that resin filling or partial plating for avoiding intrusion of the solder raises the cost.

16 Claims, 4 Drawing Sheets

PRIOR ART

PRIOR ART

SEMICONDUCTOR DEVICE WITH A SOLDER CREEP-UP PREVENTION ZONE

This application is based on Japanese patent application No. 2004-016772 the content of which is incorporated hereinto by reference.

DISCLOSURE OF THE INVENTION

1. Field of the Invention

The present invention relates to a semiconductor device, and in particular to a semiconductor device having a package structure having a size close to chip size, and an excellent heat radiation property.

2. Related Art

Recent demands on higher integration of electronic circuits having semiconductor devices incorporated therein raise another demand on down-sizing of packages of the individual semiconductor devices. Chip-size package (CSP) has been proposed as a semiconductor device successfully reduced in the package size.

U.S. Patent Publication No. 2001/0048116 discloses an exemplary case. FIG. 6 shows a plan view of the semiconductor device disclosed in the U.S. Patent Publication No. 2001/0048116, and FIG. 7 shows a vertical sectional view of the device. As shown in these drawings, the conventional semiconductor device is configured by mounting a semiconductor chip 30 in a recessed portion of a dish-formed metal plate 100, wherein the dish-formed metal plate 100 is formed by processing a metal plate having a size slightly larger than that of the semiconductor chip. The semiconductor chip 30 is exemplified by a MOS transistor chip, and has a drain electrode formed on the back surface thereof. The drain electrode is directly fixed onto a bottom surface 101 of the recessed portion using a resin 102, and the semiconductor chip 30 is molded by filling the resin 102 also in the recessed portion therearound. The semiconductor chip 30 has also a gate electrode 37 and a source electrode 40 formed on the surface thereof, so as to be aligned nearly in the same plane with the upper surface of the peripheral portion of the metal plate 100. A plurality of areas on the upper surface of the peripheral portion of the metal plate 100 are configured as drain connection electrodes 105. By mounting thus-configured semiconductor device onto a mounting substrate, not shown, in a face-down manner, the drain connection electrodes 105 are connected with pad portions for the drain connection electrodes, provided on the mounting substrate, and at the same time, the gate electrode 37 and the source electrode 40 are respectively connected to the individual pad portions provided therefor.

The semiconductor device was, however, found to have a latent problem as described below, from investigations by the present inventor. The surface of the semiconductor chip 30 and the upper surface of the peripheral portion of the metal plate 100 in the conventional semiconductor device are aligned nearly in the same plane, so that, in a process of attaching the semiconductor device onto a mounting substrate using a solder, the solder fed in a large amount to the drain connection electrodes 105 may run out from the drain connection electrodes 105 and creep up on the inner wall of the metal plate 100, and may flow to reach the boundary with an adhesive resin 103, and may produce a solder puddle inside the metal plate 100. In order to prevent the solder from contacting with the end portion of the semiconductor chip 30, it is necessary to ensure a reasonable width for the adhesive resin 103. The side face of the semiconductor chip 30 and the side wall of the metal plate 100 are therefore spaced by a relatively large gap, so as to avoid contact of the crept solder with the end portion or side face portion of the semiconductor chip 30, so that two-dimensional outer dimension of the metal plate 100 is set considerably larger than two-dimensional dimension of the semiconductor chip 30. The side face of the semiconductor chip 30 and the side wall of the metal plate 100 are spaced typically by 0.5 mm or around, and the side space of the semiconductor chip is filled with the conductive resin 102, and thereon the adhesive resin 103 is filled.

The conventional semiconductor device has a large distance between the external terminal portions of the metal plate and the semiconductor chip as described in the above, so that the size of the semiconductor device as a whole becomes larger than expected from the semiconductor chip. Shrinkage of the distance may sometimes result in contact of the solder, used for bonding in the mounting process, with the semiconductor chip, and this adversely affects the electrical characteristics and reliability. For the case where the resin filling or partial plating for the purpose of preventing the solder intrusion is not provided, the solder creeps up to a large degree and this varies amount of solder contributable to the connection, so that reliability in the connection may be less reliable, and nonconformities may occur in the environment of use. The filling of the resin into the side space of the semiconductor chip demands additional costs for the resin material and operations for the injection and curing, and this makes the device expensive. The operations become more difficult in terms of constant-volume supply of the resin and positional alignment for the injection as the space becomes smaller, and are inappropriate for small-sized devices. The partial plating additionally demands a mask and a photolithographic system allowing the selective plating, and this makes the device expensive, and cannot down-size the device because a redundant design is essential from a viewpoint of accuracy.

It is therefore an object of the present invention to provide a semiconductor device in a form of small semiconductor package in which a semiconductor chip is not molded by a resin, which is inexpensive, allows further down-sizing, and ensures a high reliability in the mounting, without partially plating the semiconductor package.

SUMMARY OF THE INVENTION

According to the present invention, there is provided a semiconductor device which comprises a U-shaped metal package base, and a semiconductor chip having at least surface electrodes and being mounted on the inner bottom portion of the U-shaped metal package base, wherein the metal package base has, in a portion thereof ranging from the opened side end portion of the inner side wall to the semiconductor chip, a creep-up preventive zone preventing solder entering from the opened side end portion from creeping up.

In other words, the present invention provides a semiconductor device which comprises a U-shaped metal package base, and a semiconductor chip having at least surface electrodes and being mounted on the inner bottom portion of the U-shaped metal package base, wherein a level of the end position of the U-shaped metal package base is set higher than the surface level of the semiconductor chip, and the metal package base has, in a portion thereof ranging from the surface position to the end position, a creep-up preventive zone preventing solder from creeping up.

The metal package base, herein, preferably has a groove carved thereon at the position of the creep-up preventive zone. The groove may be provided in the direction in parallel with the surface of the semiconductor chip.

It is also allowable that the groove is provided in the direction normal to the surface of the semiconductor chip, so as to reach the opened side end portion.

It is also allowable that the metal package base has an insulating resin zone provided thereon at the position of the creep-up preventive zone. It is still also allowable that the metal package base has a plated film formed thereon, but has no plated film at the position of the creep-up preventive zone.

The semiconductor chip preferably has, as being formed on the surface electrode, solder bumps or solder balls having an almost equal height with that of the opened side end portion.

As has been described in the above, by providing the external terminal portions as the electrodes at the opened side end portion of the metal package base processed into a U-shape, and by providing the solder creep-up preventive zone, the present invention can successfully prevent the solder from creeping from the external terminal portions up to the semiconductor chip side, and from entering the side space of the semiconductor chip, and this allows a design in which the distance between the inner wall surface of the metal package base and the side face of the semiconductor chip is set to as close as 0.10 mm or below. The solder for mounting is prevented from contacting with the side faces or surface edge portions of the semiconductor chip, and this is successful in preventing nonconformities in the electrical characteristics, and nonconformities caused by mechanical force. It is also made possible to suppress variation in spreading of the solder, so that solder geometry at the connected portions can be stabilized, and this is further successful in stabilizing reliability of the connection, and making nonconformities after the mounting less likely to occur.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
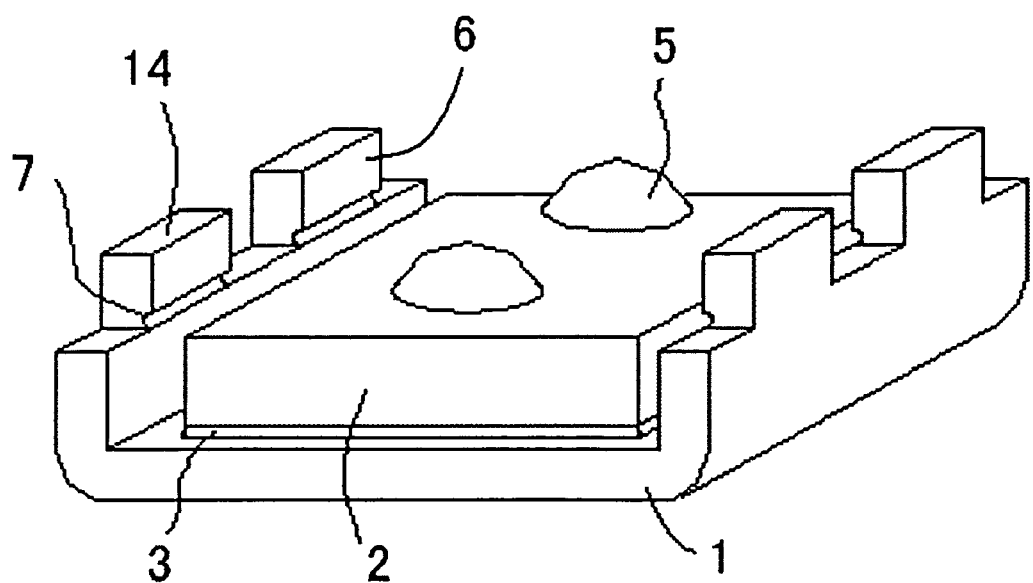
FIG. 1 is a perspective view showing a structure of a semiconductor device according to a first embodiment of the present invention.

The following paragraphs will describe the embodiments of the present invention referring to the attached drawings. FIG. 1 shows a structure of a semiconductor device according to a first embodiment of the present invention, and is a perspective view of a semiconductor device having a semiconductor chip mounted on a small-sized semiconductor package, without being molded on the outer periphery thereof with a resin.

A U-shaped metal package base 1 is composed of copper, copper alloy or the like, and has external terminal portions 6 as electrodes at the end position of the opened side end portions of the U-shaped metal package base 1. The first embodiment shows four electrodes, wherein a single electrode is also allowable. On the bottom portion inside the U-shaped metal package base 1, a semiconductor chip 2 is fixed using a conductive paste 3, for example.

This way of fixation of the semiconductor chip 2 on the bottom portion inside the U-shaped metal package base 1 makes it possible to ensure a desirable electrical connection between the semiconductor chip 2 and metal package base 1. It is, therefore, also allowable to form a plated layer 4, such as an Ag plated layer, on the inner surface, and to form the plated layer 4 further on the entire surface of the external terminal portions 6 including the outer surface thereof, to thereby ensure a necessary level of soldering property.

On the surface of the semiconductor chip 2, there are formed surface electrodes 5 for soldering respectively having a solder bump, or solder balls as the surface electrodes 5. By aligning the end portions (14) of the external terminal portions 6 and the top surface of the solder bumps as the surface electrodes 5 nearly in the same plane, or locating them within a height difference of 50 μm or less, it is made possible to collectively solder these electrodes in the process of mounting the semiconductor device onto the mounting substrate, and to connect electrodes on the back surface of the semiconductor chip 2 to the external through the external terminal portions 6, and to connect the surface electrodes 5 of the semiconductor chip 2 to the external through the solder bumps.

In the portion ranging from the opened side end portion of the inner side wall of the metal package base 1 to the semiconductor chip 2, there is provided a creep-up preventive zone preventing solder entering from the opened side end portion from creeping up.

That is, in FIG. 1, the external terminal portions 6 located at the end position of the U-shaped metal package base are configured as having the level higher than that of the surface of the semiconductor chip 2, and as having, on the inner side wall of the of the U-shaped metal package base 1, the creep-up preventive zone between the surface position of the semiconductor chip 2 and the end position of the external terminal portions 6, wherein the solder creep-up preventive zone is configured by providing a groove, or by covering with a resin. In the first embodiment, horizontal grooves 7 are formed as the solder creep-up preventive zone, in parallel with the surface of the semiconductor chip 2, wherein the grooves 7 are formed at a level almost equivalent to the surface level of the fixed semiconductor chip 2, or at a position more closer to the external terminal portions 6.

Figure 2A:
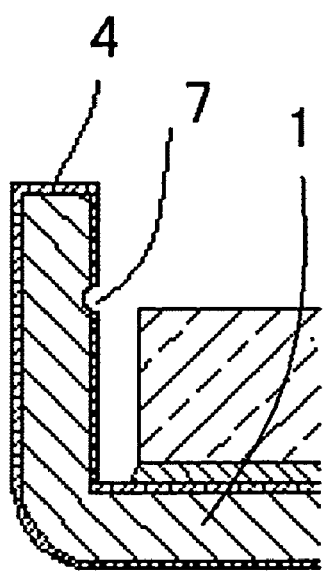
FIGS. 2A to 2C are enlarged views of portions of semiconductor devices according to first, second and third embodiments, respectively.

FIG. 2A shows an enlarged sectional view including a portion of the groove 7. The surface of the metal package base 1 is covered with the plated layer 4, but it is also allowable to remove the plated layer 4 from the portion of the groove 7. Metal package base 1 will be plated after being shaped by pressing, etching or the like, wherein scratching made on the surface of the plated layer 4 results in removal of the plated layer 4 and makes the plated surface discontinuous, and the groove 7 will consequently be formed.

Figure 3A:
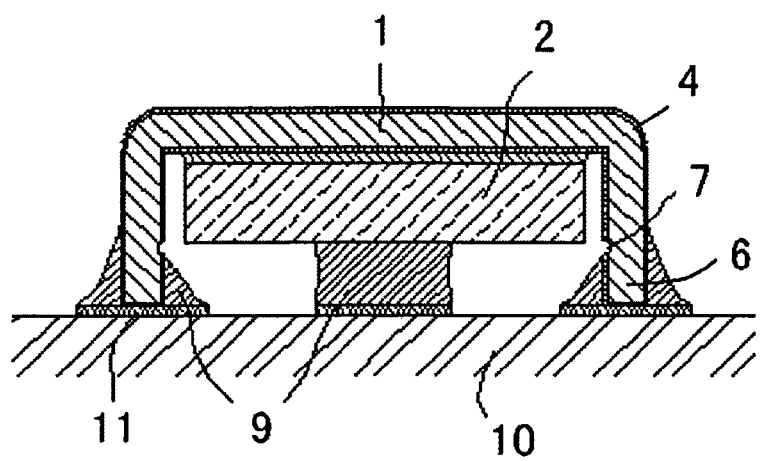
FIGS. 3A and 3B are sectional views of the semiconductor devices mounted on the mounting substrates according to the first and second embodiments, respectively.

FIG. 3A is a sectional view of the semiconductor device of the first embodiment mounted on a mounting substrate 10, showing an exemplary case using a solder for mounting. When the substrate copper foil pattern 11 provided on the mounting substrate 10 and the external terminal portions 6 are connected using a solder 9, the solder 9 melts under heating, and the molten solder creeps up from the end portions 14 of the external terminal portions 6 towards the direction of mounting of the semiconductor chip 2. The groove 7 functions as a discontinuous portion capable of blocking the spreading of the solder 9 if the plated layer 4 is preliminarily removed therefrom, and can limit the creep-up of the solder 9 on this side of the groove 7. This successfully prevents the solder 9 for mounting from entering the side space of the semiconductor chip 2 as shown in FIG. 3A. It is therefore made possible to avoid any electrical nonconformities caused by the solder 9 contacting with the side faces or surface edge portions of the semiconductor chip 2, and any nonconformities ascribable to mechanical force. This consequently makes it possible to design the distance between the metal package base 1 and the side face of the semiconductor chip 2 shorter than that in the conventional case, or to make them closer with a distance typically as short as of 0.10 mm or less, and more specifically, the distance can be reduced to as short as 0.05 mm. It is also successful in suppressing variation in the spreading of the solder 9, and this makes it possible to stabilize geometry of the solder 9 at the connection portion, to consequently stabilize reliability of the connection, and to make any nonconformities after the mounting less likely to occur.

Figure 2B:
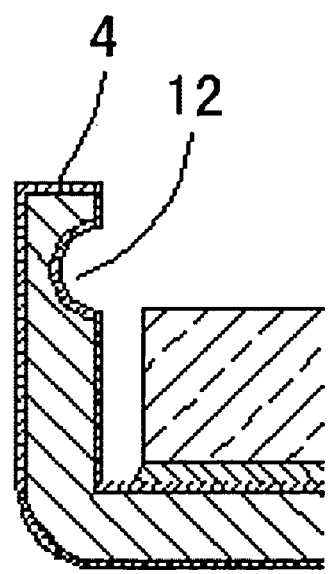
Figure 3B:
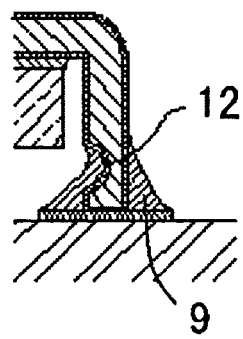

FIG. 2B shows a second embodiment, in which a groove 12 is formed by pressing, etching or the like, at the time when the metal package base 1 is shaped, and the plated layer 4 is then formed by plating on the inner wall of the groove, wherein the groove has a width and a depth larger than those in the first embodiment. The groove 12 is formed, similarly to as described in the first embodiment, on the inner surface of the external connection portions 6 in the horizontal direction in parallel with the surface of the semiconductor chip 2 (that is, in the direction normal to the sheet of FIG. 2B), wherein the lower edge of the groove 12 is formed so as to be aligned at an almost equal level of height with the surface level of the semiconductor chip, or so as to be more closer to the external terminal portions 6. FIG. 3B is a partial sectional view of the semiconductor devices mounted on the mounting substrates according to the second embodiment. In this configuration, the solder 9 may flow into the groove 12, but is limited from flowing out from the groove 12 by ensuring a sufficiently large capacity of the groove 12 as compared with volume of the solder 9. The groove 12 can, therefore, function as a discontinuous portion preventing the spreading of the solder 9 as shown in FIG. 3B, and can limit thereat the creep-up of the solder 9.

Figure 2C:
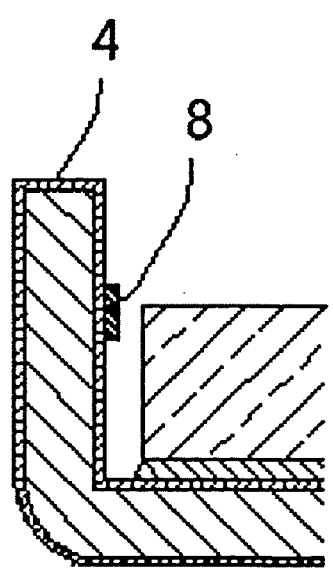

FIG. 2C shows a third embodiment, in which an insulating resin zone 8 is formed as a discontinuous portion blocking the spreading of the solder 9. The insulating resin zone 8 is formed on the inner surface of the external terminal portions 6 in horizontal direction in parallel with the surface of the semiconductor chip 2 (that is, the direction normal to the sheet of FIG. 2C), so that any portion of the insulating resin zone 8 reaches a level almost equivalent to the surface level of the semiconductor chip 2. The insulating resin zone 8 can be formed by transferring or coating an ink mainly containing a heat-resistant resin such as epoxy resin, followed by and curing through drying, heating or UV irradiation. In this configuration, the solder 9 is successfully limited from flowing out from the insulating resin zone 8, and similarly to as described in the first embodiment, the insulating resin zone 8 functions as the discontinuous portion capable of blocking the spreading of the solder 9, and can limit the creep-up of the solder 9 at the portion of the insulating resin zone 8. It is also allowable to combine the insulating resin zone 8 with the groove similarly to as described in the above, so as to suppress blurring of the insulating resin zone 8 (or, intrusion of the solder around the semiconductor chip 2).

Figure 4:
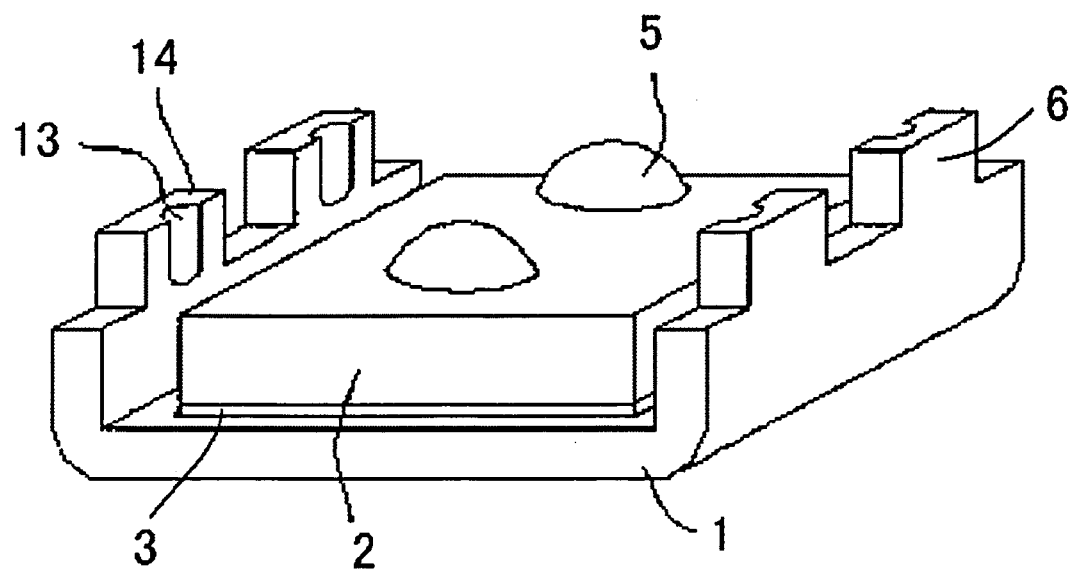
FIG. 4 is a perspective view showing a structure of a semiconductor device according to a fourth embodiment.
Figure 5:
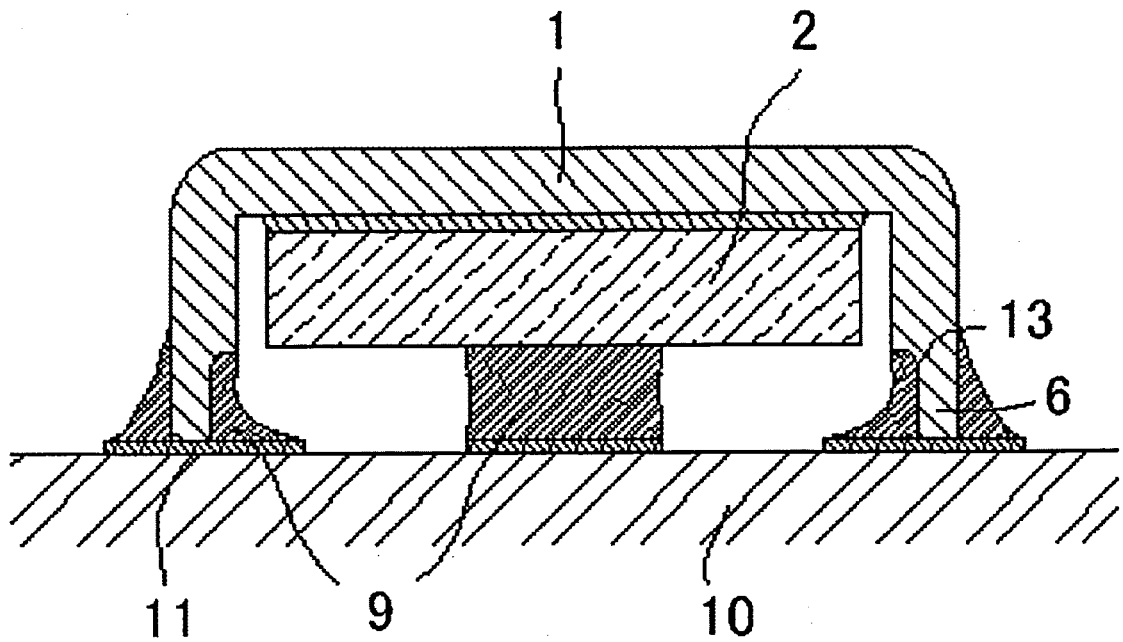
FIG. 5 is a sectional view showing the semiconductor device of the fourth embodiment mounted on a mounting substrate.
Figure 6:
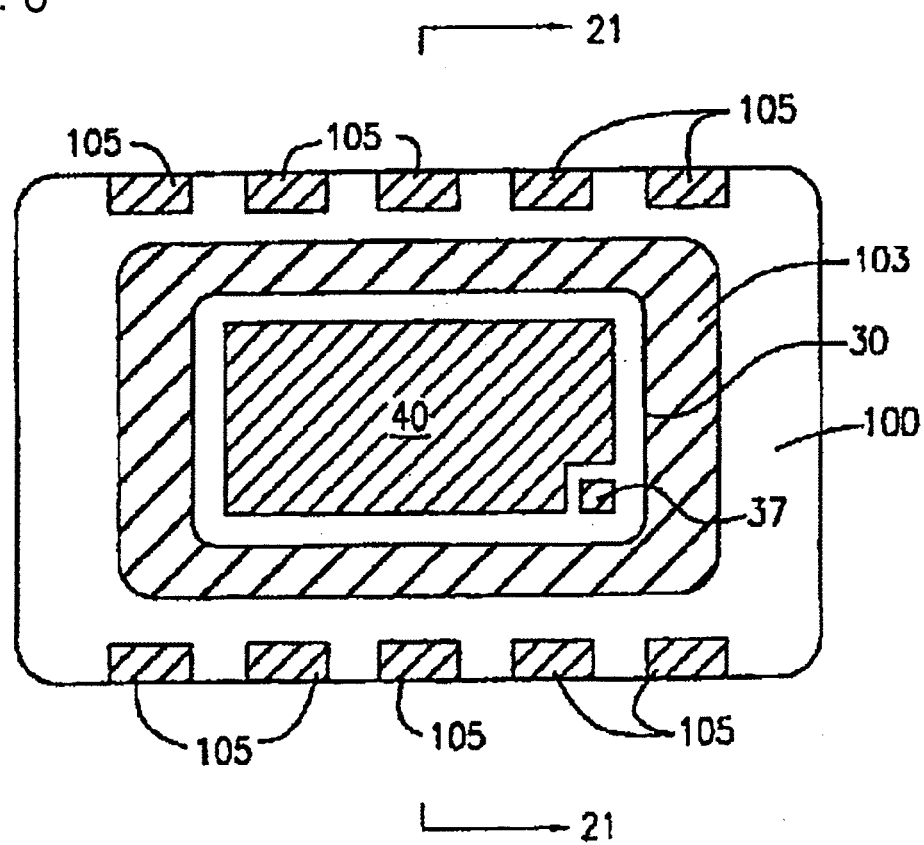
FIG. 6 is a plan view of an example of a conventional semiconductor device.
Figure 7:
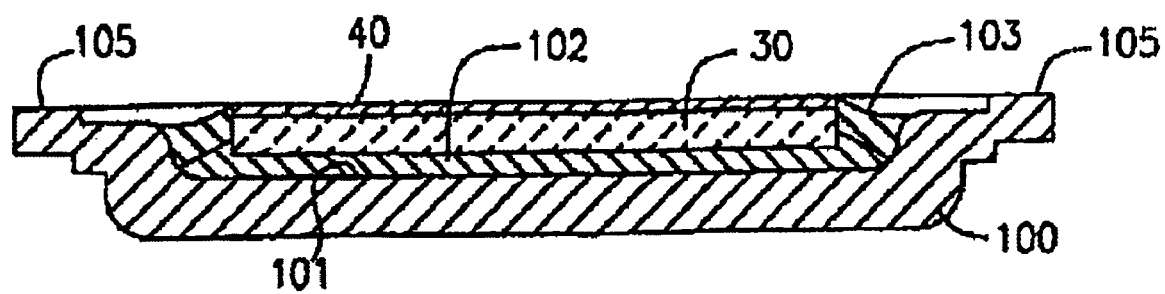
FIG. 7 is a sectional view showing an example of a conventional semiconductor device.

FIG. 4 shows a fourth embodiment, in which a vertical groove 13 is formed on the inner surface of each of the external terminal portions 6, wherein the groove 13 is formed so as to rise up from a level almost equivalent to the surface level of the semiconductor chip 2 to reach the end portion 14 in the direction normal to the surface of the semiconductor chip 2. FIG. 5 is a sectional view of a mounted state of the semiconductor device of the fourth embodiment. In this configuration, the solder 9 may flow into the groove 13, but can be limited from flowing out therefrom by ensuring a capacity of the groove 13 sufficiently larger than the volume of the solder 9. The groove 13 can therefore function as the discontinuous portion capable of blocking the spreading of the solder 9, and can limit the creep-up of the solder 9 at the portion of the groove 13.

The above-described embodiments have described the exemplary cases where the present invention was applied MOSFET, but the present invention can similarly be applied also to semiconductor devices having, incorporated therein, any other semiconductor chips such as bipolar transistor, diode and IC.

It is apparent that the present invention is not limited to the above embodiments, that may be modified and changed without departing from the scope and spirit of the invention.

What is claimed is:

1. A semiconductor device, comprising:
a U-shaped metal package base; and
a semiconductor chip having at least one surface electrode and being mounted on an inner bottom portion of said U-shaped metal package base,
said metal package base including, in a portion thereof between an opened side end portion of an inner side wall and said semiconductor chip, a creep-up preventive zone preventing solder entering from said opened side end portion from creeping toward said semiconductor chip.

2. The semiconductor device according to claim 1, wherein said metal package base comprises a plated film formed thereon, but has no plated film at the position of said creep-up preventive zone.

3. The semiconductor device according to claim 1, wherein said semiconductor chip comprising one of said surface electrode, solder bumps and solder balls at a level almost equivalent to the level of said opened side end portion.

4. The semiconductor device according to claim 1, wherein a side surface of said semiconductor chip is not covered by a resin.

5. The semiconductor device according to claim 1, wherein said metal package base comprises an insulating resin zone provided thereon at the position of said creep-up preventive zone.

6. The semiconductor device according to claim 5, wherein said insulating resin zone comprises a lower edge aligned at the position between the surface of the semiconductor chip and the opened side end portion.

7. The semiconductor device according to claim 1, wherein said metal package base comprises a groove carved thereon at the position of said creep-up preventive zone.

8. The semiconductor device according to claim 7, wherein said groove is provided in the direction in parallel with the surface of said semiconductor chip.

9. The semiconductor device according to claim 8, wherein said groove comprises a sufficient volume capacity to prevent solder from creeping toward said semiconductor chip to enter said opened side end portion.

10. The semiconductor device according to claim 9, wherein a part of the solder flows into the groove.

11. The semiconductor device according to claim 7, wherein said groove is provided in the direction normal to the surface of said semiconductor chip, so as to reach said opened side end portion.

12. The semiconductor device according to claim 11, wherein said groove comprises a sufficient volume capacity to prevent solder from creeping toward said semiconductor chip to enter said opened side end portion.

13. The semiconductor device according to claim 7, wherein said groove comprises a lower edge aligned at the position between the surface of the semiconductor chip and the opened side end portion.

14. The semiconductor device according to claim 7, wherein said groove having a plated film at the inner surface thereof is formed in the position between a substantially equivalent height with a surface level of said semiconductor chip and said opened side end portion.

15. A semiconductor device, comprising:
a metal package base that mounts a semiconductor chip on an inner bottom portion of said metal package base and that mounts to a substrate at an opened side end portion of said metal package base,
wherein said metal package base includes, in a portion thereof between said opened side end portion of an inner side wall and said inner bottom portion, a creep-up preventive zone comprising a groove carved thereon for preventing solder entering from said opened side end portion and creeping toward said inner bottom portion of said metal package base.

16. A semiconductor device, comprising:
a metal package base that mounts a semiconductor chip on an inner bottom portion of said metal package base and that mounts to a substrate at an opened side end portion of said metal package base,
wherein said metal package base includes, in a portion thereof between said opened side end portion of an inner side wall and said inner bottom portion, a creep-up preventive zone comprising an insulating resin zone thereon for preventing solder entering from said opened side end portion and creeping toward said inner bottom portion of said metal package base.

* * * * *